(12) United States Patent
Aihara et al.

(10) Patent No.: US 6,200,516 B1
(45) Date of Patent: Mar. 13, 2001

(54) PRODUCTION OF CORROSION-RESISTANT CERAMIC MEMBERS

(75) Inventors: Yasufumi Aihara, Nagoya; Akira Narukawa, Yokkaichi; Keiichiro Watanabe, Kasugai; Shinji Kawasaki, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/246,834

(22) Filed: Feb. 8, 1999

(30) Foreign Application Priority Data

Feb. 25, 1998 (JP) .................................................. 10-043251

(51) Int. Cl.$^7$ ................................................. C04B 35/10
(52) U.S. Cl. ........................................ 264/618; 427/126.4
(58) Field of Search .......................... 264/618; 427/126.4

(56) References Cited

U.S. PATENT DOCUMENTS

| 5,306,865 | 4/1994 | Ryusuke et al. . |
| 5,403,618 | 4/1995 | Christopher et al. . |

FOREIGN PATENT DOCUMENTS

| 5-251365 | 9/1993 | (JP) . |
| 7-273053 | 10/1995 | (JP) . |

*Primary Examiner*—Daniel J. Jenkins
(74) *Attorney, Agent, or Firm*—Burr & Brown

(57) ABSTRACT

A process is disclosed for producing a corrosion-resistant ceramic member, which process includes the steps of preparing a sintered body made of a ceramic material containing at least aluminum, immersing the ceramic sintered body in hydrofluoric acid, and forming a film of aluminum fluoride at a surface layer portion of the ceramic sintered body by heating the ceramic sintered body.

37 Claims, 1 Drawing Sheet

PRODUCTION OF CORROSION-RESISTANT CERAMIC MEMBERS

BACKGROUND OF THE INVENTION

Field of the Invention

The present invention relates to a process for producing corrosion-resistant ceramic members. More particularly, the invention relates to a process for producing corrosion-resistant ceramic members, which are to be favorably used as members in semiconductor-producing apparatuses such as heat CVD apparatuses.

With the increase in memory capacity of super LSIs, the degree of fine processing of such super LSIs has been increasing greatly, and processes requiring chemical reactions have been expanded. Particularly, in the semiconductor-producing apparatuses requiring a super clean state, a halogen-based corrosive gas, such as a chlorine-based gas or a fluorine-based gas, is used as a deposition gas, an etching gas or a cleaning gas.

In a heating apparatus-in which a semiconductor is heated while being contacted with such a corrosive gas, for example, a semiconductor-producing apparatus such as a heat CVD apparatus, a semiconductor-cleaning gas composed of a halogen-based corrosive gas such as $ClF_3$, $NF_3$, $CF_4$, HF or HCl is used after the deposition. In the depositing step, another halogen-based corrosive gas such as $WF_5$ or $SiH_2Cl_2$ is used as a film-forming gas.

Each of the members constituting the semiconductor-producing apparatus is made of alumina or aluminum nitride. When such members are exposed to and contacted with the above halogen-based corrosive gases at a high temperature, their surfaces corrode and subsequently, the corroded portion peel from the members in the form of particles.

If such particles are heaped on a substrate placed in the semiconductor-producing apparatus, the heaped particles cause insufficient insulation or insufficient conductivity resulting in making the semiconductor unacceptable.

In view of the above problem, NGK Insulators, Ltd. disclosed in Japanese patent application No. 3-150,932 (filed on May 28, 1991) and Japanese patent application No. 4-58,727 (filed on Feb. 13, 1992) that a sintered body made of aluminum nitride with a layer of aluminum fluoride on the surface thereof exhibits high corrosion resistance against plasmas of the above noted halogen-based corrosive gases. That is, even when the aluminum nitride sintered body is exposed to the $ClF_3$ gas or similar gas for one hour, the surface state of the sintered body does not change.

Further, NGK Insulators, Ltd. disclosed in JP-A 5-251,365 that a film of aluminum fluoride is formed on a surface of a sintered body made of aluminum nitride by using a gas phase growing method.

Further, it is disclosed in JP-A 7-273,053 that in order to prevent corrosion of the surface of an electrostatic chuck for semiconductor wafers, the surface is subjected to a surface treatment in which a film of aluminum fluoride is formed through preliminarily replacing the surface of the electrostatic chuck by fluorine with use of fluorine plasma.

The aluminum fluoride layer on the surface of the aluminum nitride sintered body as described in Japanese patent application No. 3-150,932 and Japanese patent application No. 4-58,727 may be formed by using the sputtering technique. However, when the sputtering technique is used, only the surface of the sintered body opposed to a sputtering target is covered with aluminum fluoride. Therefore, if the member to be covered has a cylindrical shape, it is difficult to cover a peripheral face of the member.

If the gas phase growing technique as disclosed in JP-A 5-251,365 is used, the above-mentioned problem can be prevented, because the raw gas to be subjected to a reaction is fed to a peripheral surface of a cylindrical member. Further, if the fluorine plasma is used as disclosed in JP-A 7-273,053, the above-mentioned problem can be also prevented, because the fluorine-based gas to generate the plasma is sufficiently fed to the peripheral surface of the cylindrical member.

However, in order to completely cover the member with aluminum fluoride, each of the gas phase growing reaction and the plasma processing needs to be continuously effected for 50 hours or more in these techniques. Thus, clearly, these techniques require a lengthy processing time which leads to extremely poor productivity.

Further, if the gas phase growing reaction or the plasma treatment is effected with the fluorine-based gas for a long time period, the chamber used for effecting the above reaction or treatment is also corroded, thereby increasing the costs of processing.

SUMMARY OF THE INVENTION

It is an object of the present invention to provide a new process for producing a corrosion-resistant ceramic member by forming a film of aluminum fluoride at a surface portion of the ceramic sintered body.

The present invention relates to the process for producing a corrosion-resistant ceramic member, comprising the steps of preparing a sintered body made of a ceramic material containing at least aluminum, immersing the ceramic sintered body in hydrofluoric acid, and forming a film of aluminum fluoride at a surface layer portion of the ceramic sintered body by heating the ceramic sintered body.

According to the corrosion-resistant ceramic member-producing process of the present invention, the aluminum fluoride film can be formed over the entire surface portion of the ceramic sintered body containing at least aluminum by directly immersing the sintered body in hydrofluoric acid and effecting the following reaction through heating the sintered body.

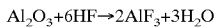

$$Al_2O_3 + 6HF \rightarrow 2AlF_3 + 3H_2O$$

Further, according to the process of the present invention, since a film of aluminum fluoride having high corrosion resistance can be formed at the surface portion of the ceramic sintered body in a relatively short time period, about 5 to 20 hours, the process of the present invention enables the corrosion-resistant ceramic members to be produced at a low cost and high rate of production.

The present invention a process for producing a corrosion-resistant ceramic member, comprising the steps of preparing a first sintered body made of a ceramic material containing at least aluminum, immersing the ceramic sintered body in hydrofluoric acid, forming a first film of aluminum fluoride at a surface layer portion of the ceramic sintered body by heating the ceramic sintered body, separately preparing at least one second sintered body made of a ceramic material containing at least aluminum, generating a gaseous product containing aluminum fluoride through corroding a surface of said at least one second ceramic sintered body by contacting the second ceramic sintered body with a fluorine-based corrosive gas, and forming a second film of aluminum fluoride by precipitating the gaseous product on the first aluminum fluoride film of the first ceramic sintered body.

These and other objects, features and advantages of the invention will be apparent upon reading of the following description of the invention when taken in conjunction with the attached drawing, with the understanding that some modifications, variations and changes could be easily made by the skilled person in the art to which the invention pertains.

BRIEF DESCRIPTION OF THE DRAWING

For a better understanding of the invention, reference is made to the attached drawing, wherein.

DETAILED DESCRIPTION OF THE INVENTION

Figure 1:
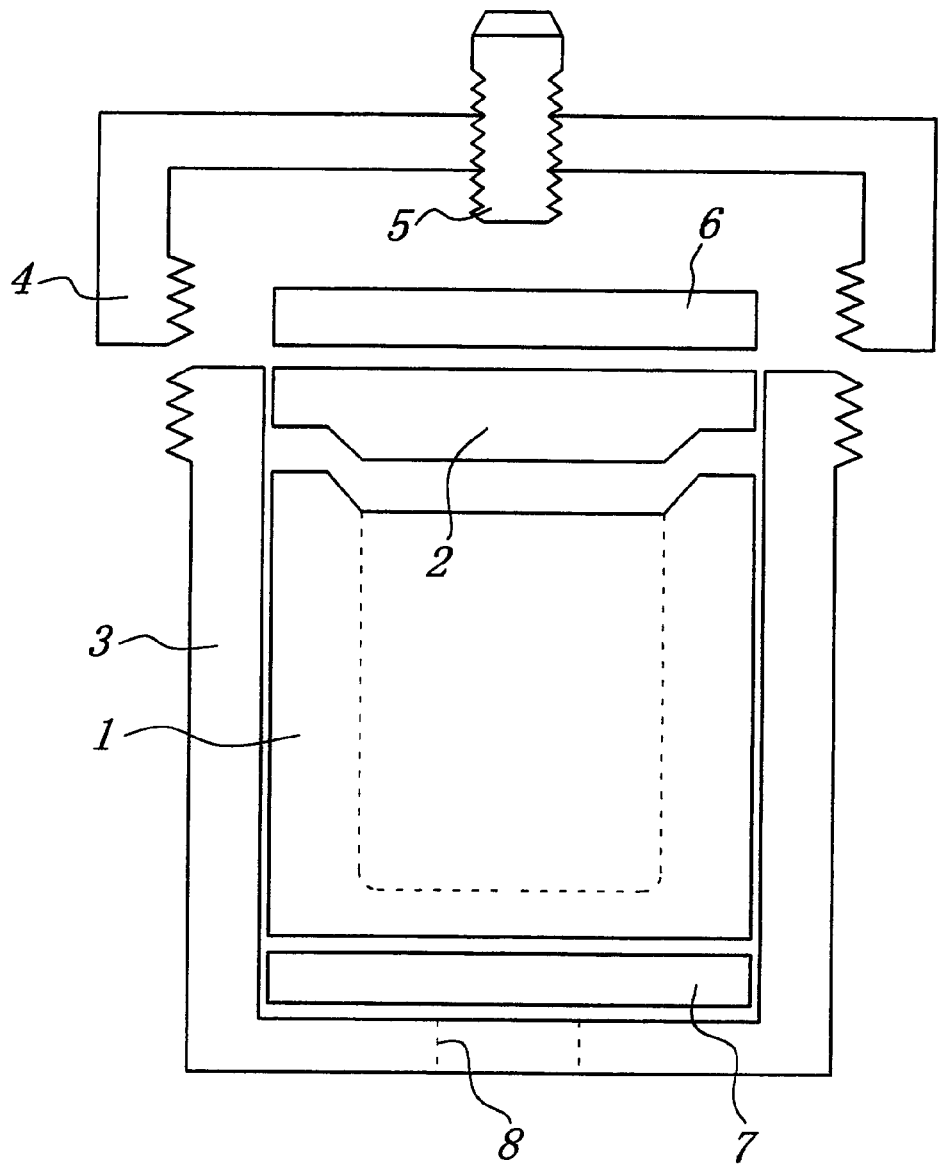
FIG. 1 is a sectional view of an example of a reaction container for effecting the present invention.

The present invention will be explained in more detail with reference to specific examples of the present invention.

Since a film of aluminum fluoride needs to be formed at a surface portion of the ceramic sintered body, aluminum must be contained in the ceramic sintered body to be used in the present invention. As specific examples, alumina ($Al_2O_3$), aluminum nitride (AlN), mullite ($3Al_2O_3$—$2SiO_2$) and spinel (MgO—$Al_2O_3$) may be used, for example, as a material for the sintered body.
(0012)

The sintered body is produced by mixing a ceramic powder as a raw material preferably with a binder, by means of ball milling or the like, obtaining a pressed body by a uniaxial pressing, and pressureless sintering or hot press sintering the pressed body. The sintered body is treated, that is surface-treated e.g., ground, polished or sand blasted, in order that the sintered body may then be subjected to a reaction with hydrofluoric acid.

A film of aluminum fluoride is formed in the ceramic sintered body according to the present invention by using a reacting container shown in FIG. 1, in the following manner.

A given amount of hydrofluoric acid is placed in a Teflon container 1, a ceramic sintered body made of alumina, for example, is placed therein. Thereafter, the Teflon container 1 is covered with a Teflon lid 2 to seal the container.

Next, the Teflon container 1 is placed in a stainless holding container 3 via a lower plate 7 for the stainless holding container, and a stainless lid 4 is screwed to the stainless holding container 3.

Next, a tightening bolt 5 provided in the stainless lid 4 is screwed inwardly to seal the Teflon lid 2 to the Teflon container 1 via the upper plate 6 for the stainless holding container.

The sintered body is heated to a given temperature by placing the stainless holding container 3 in a drying unit, for example. At that time, HF gas permeating the Teflon container is released to the outside through a gas escape hole 8.

The concentration of hydrofluoric acid is not particularly limited, but the concentration is preferably 1 to 50 wt % so as to form a uniform film of aluminum fluoride around the ceramic sintered body.

In order to form a film of aluminum fluoride that does not peel or crack even if the sintered body is subjected to a heating/cooling test wherein it is heated to a given temperature and then left to be cooled to room temperature, the concentration of hydrofluoric acid is preferably 1 to 40 wt %. Further, in order to form a film of aluminum fluoride that does not peel or crack even if the sintered body is subjected to a heating/rapid cooling test where it is heated to a given temperature, and then cooled in water, the concentration of hydrofluoric acid is preferably 5 to 30 wt %.

The temperature at which the sintered body is heated according to the method of the present invention is not particularly limited as long as a film of aluminum fluoride is formed over the surface of the ceramic sintered body. However, in order to form a film of aluminum fluoride in a shorter time period and to form such a film of aluminum fluoride that does not peel or crack even if the sintered body is subjected to a heating/cooling test, the heating is effected preferably at a temperature of 100° C. to 250° C. Further, in order to form a film of aluminum fluoride that does not peel or crack even if the sintered body is subjected to a heating/rapid cooling test, the heating is preferably effected at 130° C. to 200° C.

The thickness of the aluminum fluoride thus formed is preferably 0.5 $\mu$m to 100 $\mu$m to afford sufficient corrosion resistance upon the ceramic sintered body as a substrate, more preferably the thickness is 1 $\mu$m to 50 $\mu$m.

Further, in order to remove excess hydrofluoric acid attached to the sintered body after the treatment and to improve adhesion of the aluminum fluoride film to the sintered body, the ceramic sintered body formed with the aluminum fluoride as mentioned above is preferably heated at 200° C. to 500° C. in air.

The time period required for the formation of a film of aluminum fluoride having a thickness of 1 $\mu$m to 50 $\mu$m under the above-mentioned condition is 5 to 20 hours, thus making the treating time period shorter and increasing productivity, when compared with the conventional gas phase growing technique and the plasma treating technique. Further, since only simple heating devices such as the Teflon container and the drying unit are required in the method of the present invention, the treatment cost can be decreased further.

The corrosion-resistant ceramic member produced according to the method of the present invention can be effectively used as a substrate for a member which is to be exposed to temperatures as high as 400° C. to 500° C. Examples include a member for a semiconductor-producing apparatus such as a heat CVD apparatus, a susceptor to be heated through heating with an infrared lamp, a ceramic heater for heating semiconductors, a susceptor placed on a heating surface of the ceramic heater, a susceptor in which an electrostatically chucking electrode is buried, a susceptor in which an electrostatically chucking electrode and a resistive heating element are buried, a susceptor in which a high frequency plasma generating electrode is buried, or a susceptor in which a high frequency plasma generating electrode and a resistive heating element are buried.

Members normally, exposed to such high temperatures are generally largely corroded with a fluorine-based corrosive gas in particular. A film of aluminum fluoride formed in the surface portion of the ceramic sintered body made of alumina, aluminum nitride or the like in a thickness of 0.5 to 100 $\mu$m according to the method of the present invention acts as a barrier layer against the above fluorine-based corrosive gas and prevents corrosion of the ceramic sintered body. As a result, the formation of particles which leads to defects of the semiconductors can be prevented.

The corrosion-resistant ceramic member produced according to the method of the present invention can also be effectively used as substrate for a member which is to be exposed to a relatively low temperature of 200° C. to 400° C., such as a shower plate.

As mentioned above, a member exposed to a fluoine-based corrosive gas at a high temperature is corroded at its surface portion, and a gaseous product of a fluoride is generated. If the gaseous product floats in a vacuum chamber in which the semiconductor-producing apparatus is placed, and reaches the above member at the relatively lower temperature, the gaseous product is deposited on the surface of the member.

Although the member at such a relatively lower temperature is also made of a ceramic sintered body of such as alumina or aluminum nitride similar to the high temperature members, the coefficient of thermal expansion and the crystalline structure differ between the ceramic sintered body and the fluoride formed through the deposition of the gaseous product. Adhesion between the ceramic sintered body and the deposited fluoride is low, so that the fluoride peels in the form of particles. Such particles cause the defects of the semiconductors as described in connection with the prior art.

In this case, if a film of aluminum fluoride is preliminarily formed in a surface portion of the above ceramic sintered body constituting the above low temperature member by heating the sintered body immersed in hydrofluoric acid under the above-mentioned condition and the above gaseous fluoride product is deposited on the surface of the ceramic sintered body, the deposited fluoride will not peel, because the preliminarily formed film and the deposited film are both made of fluorides and their coefficients of thermal expansion and the crystalline structures are similar.

Since the ceramic sintered body used in the present invention contains aluminum, a gaseous product of aluminum fluoride is generated when the ceramic sintered body is exposed to the fluorine-based corrosive gas.

Thus, in this case, since the film formed on the surface of the ceramic sintered body and the deposited fluoride are both aluminum fluoride, adhesion between the two is extremely high.

Due to this high adhesion the deposited aluminum fluoride will not peel but instead, will remain on the aluminum fluoride film formed on the surface of the ceramic sintered body. This means that an additional film of aluminum fluoride is formed on the existing film of aluminum fluoride on the sintered body.

Experiment

The present invention will now be explained in more detail with reference to examples.

Alumina powder (particle size: 0.5 $\mu$m) was used as the ceramic material.

This raw material powder was uniaxially pressed under pressure of 200 kgf/cm$^2$, thereby obtaining a pressed body having a rectangular parallel piped shape, and a sintered body of 60 mm in length, 60 mm in width and 20 mm in thickness was produced by firing and sintering the pressed body at 1600° C. for 4 hours. A test piece having 10 mm in length, 10 mm width and 5 mm in thickness was cut out from the thus obtained sintered body, and both its surfaces, 10 mm×10 mm, were ground at Ra≅0.5 $\mu$m.

The test piece was placed in the reaction Teflon container 1 shown in FIG. 1 together with 20 cc of hydrofluoric acid having a concentration given in Table 1, and this Teflon container 1 was placed and held in the stainless holding container 3 in the same procedure mentioned above.

Next, the stainless holding container 3 was placed in a drying unit (manufactured by Yamato Kagakusha Co., Ltd.), and heated to a temperature given in Table 1, thereby treating the alumina sintered body with hydrofluoric acid. The heating time period was 15 hours.

Thereafter, the treated test piece was left at room temperature, and cooled to 30° C. or less, and then taken out.

The surface of the alumina sintered body after the heat treatment in hydrofluoric acid was observed by SEM and analyzed by X rays, in order to determine whether or not a film of aluminum fluoride was formed. Results are shown in Table 1.

TABLE 1

|  | 80° C. | 100° C. | 130° C. | 150° C. | 200° C. | 250° C. | 300° C. |
|---|---|---|---|---|---|---|---|
| 1% HF | not changed | etched | etched | granular | ○ | ○ | △ |
| 5% HF | not changed | etched | etched | ◉ | ◉ | ○ | △ |
| 15% HF | not changed | etched | ◉ | ◉ | ◉ | ○ | △ |
| 30% HF | not changed | ○ | ◉ | ◉ | ○ | ○ | △ |
| 40% HF | not changed | needled | needled | ○ | ○ | △ | △ |
| 50% HF | not changed | needled | needled | needled | △ | △ | △ |

Notchanged: The microstructure was not changed.
Etched: The surface was corroded.
Granular: Granular AlF$_3$ particles were deposited, and a film of AlF$_3$ was not formed.
Needled: Needle-shaped AlF$_3$ particles were deposited, and a film of AlF$_3$ was not formed.
◉: After the test piece was heated at 500° C. in air, the AlF$_3$ film was not peeled or cracked through rapid cooling by falling it into water.
○: After the test piece was heated at 500° C. in air, the AlF$_3$ film was not peeled or cracked through being left to be cooled at room temperature.
△ After the test piece was heated at 500° C. in air, the AlF$_3$ film was peeled and/or cracked through being left to be cooled at room temperature.

The peeling and/or cracking of the AlF$_3$ film were confirmed by the SEM observation.

As shown in Table 1, according to the corrosion-resistant ceramic member-producing process of the present invention, a film of aluminum fluoride can be formed in the surface portion of the ceramic sintered body.

Further, if the heating temperature is 130 to 200° C., a film of aluminum fluoride can be formed on the ceramic sintered body without peeling or cracking even using the heating/rapid cooling test, when the concentration of hydrofluoride acid is 5 to 30 wt %.

As mentioned above, according to the method of the present invention, since a film of aluminum fluoride is formed at the surface portion of the ceramic sintered body by directly immersing the ceramic sintered body containing at least aluminum in hydrofluoric acid and heating it, the present invention can provide a method for producing, with high productivity, a corrosion-resistant ceramic member the surface of which will not be corroded even if the ceramic member is exposed to a halogen-based corrosive gas.

What is claimed is:

1. A process for producing a corrosion-resistant ceramic member, comprising the steps of preparing a sintered body made of a ceramic material containing at least aluminum, immersing the ceramic sintered body in hydrofluoric acid, and forming a film of aluminum fluoride at a surface layer portion of the ceramic sintered body by heating the ceramic sintered body.

2. The producing process set forth in claim 1, wherein the ceramic sintered body is heated at a temperature of 100 to 250° C.

3. The producing process set forth in claim 1, wherein the ceramic sintered body is heated at a temperature of 130 to 200° C.

4. The producing process set forth in claim 1, wherein the concentration of the hydrofluoric acid is 1 to 50 wt %.

5. The producing process set forth in claim 4, wherein the concentration of the hydrofluoric acid is 1 to 40 wt %.

6. The producing process set forth in claim 5, wherein the concentration of the hydrofluoric acid is 5 to 30 wt %.

7. The producing process set forth in claim 3, wherein the corrosion-resistance ceramic member is exposed to a halogen-based corrosive gas in a semiconductor-producing apparatus.

8. The producing process set forth in claim 4, wherein the corrosion-resistance ceramic member is exposed to a halogen-based corrosive gas in a semiconductor-producing apparatus.

9. The producing process set forth in claim 5, wherein the corrosion-resistance ceramic member is exposed to a halogen-based corrosive gas in a semiconductor-producing apparatus.

10. The producing process set forth in claim 6, wherein the corrosion-resistance ceramic member is exposed to a halogen-based corrosive gas in a semiconductor-producing apparatus.

11. A process for producing a corrosion-resistant ceramic member, comprising the steps of preparing a first sintered body made of a ceramic material containing at least aluminum, immersing the ceramic sintered body in hydrofluoric acid, forming a first film of aluminum fluoride at a surface layer portion of the ceramic sintered body by heating the ceramic sintered body, separately preparing at least one second sintered body made of a ceramic material containing at least aluminum, generating a gaseous product containing aluminum fluoride through corroding a surface of said at least one second ceramic sintered body by contacting the second ceramic sintered body with a fluorine-based corrosive gas, and forming a second film of aluminum fluoride by precipitating the gaseous product on the first aluminum fluoride film of the first ceramic sintered body.

12. A process for producing a corrosion-resistant ceramic member in a semiconductor-producing apparatus, the ceramic member being expected to be exposed to a halogen-based corrosive gas when in use, which process comprises:

(a) preparing a sintered body made of a ceramic material selected from the group consisting of alumina ($Al_2O_3$), aluminum nitride (AlN), mullite ($3Al_2O_3.2SiO_2$) and spinel ($MgO.Al_2O_3$);

(b) immersing the entire ceramic sintered body into hydrofluoric acid having a concentration of 1 to 50 wt %; and (c) heating the ceramic sintered body at a temperature of 100 to 250° C. in the hydrofluoric acid, to form a film of aluminum fluoride.

13. The process set forth in claim 12, wherein heating step (c) is conducted for 5 to 20 hours to form the film of aluminum fluoride.

14. The process set forth in claim 12, wherein steps (b) and (c) are conducted in a sealed container.

15. The process set forth in claim 13, wherein steps (b) and (c) are conducted in a sealed container.

16. The process set forth in claim 12, which further comprises:

(d) further heating the ceramic sintered body in air at a temperature of 200 to 500° C. after step (c).

17. The process set forth in claim 13, which further comprises:

(d) further heating the ceramic sintered body in air at a temperature of 200 to 500° C. after step (c).

18. The process set forth in claim 14, which further comprises:

(d) further heating the ceramic sintered body in air at a temperature of 200 to 500° C. after step (c).

19. The process set forth in claim 12, wherein the ceramic material is alumina ($Al_2O_3$).

20. The process set forth in claim 13, wherein the ceramic material is alumina ($Al_2O_3$).

21. The process set forth in claim 14, wherein the ceramic material is alumina ($Al_2O_3$).

22. The process set forth in claim 16, wherein the ceramic material is alumina ($Al_2O_3$).

23. The process set forth in claim 12, wherein the hydrofluoric acid has a concentration of 5 to 30 wt %.

24. The process set forth in claim 13, wherein the hydrofluoric acid has a concentration of 5 to 30 wt %.

25. The process set forth in claim 14, wherein the hydrofluoric acid has a concentration of 5 to 30 wt %.

26. The process set forth in claim 16, wherein the hydrofluoric acid has a concentration of 5 to 30 wt %.

27. The process set forth in claim 19, wherein the hydrofluoric acid has a concentration of 5 to 30 wt %.

28. The process set forth in claim 12, wherein the ceramic sintered body is heated in step (c) at 130 to 200° C.

29. The process set forth in claim 13, wherein the ceramic sintered body is heated in step (c) at 130 to 200° C.

30. The process set forth in claim 14, wherein the ceramic sintered body is heated in step (c) at 130 to 200° C.

31. The process set forth in claim 16, wherein the ceramic sintered body is heated in step (c) at 130 to 200° C.

32. The process set forth in claim 19, wherein the ceramic sintered body is heated in step (c) at 130 to 200° C.

33. The process set forth in claim 23, wherein the ceramic sintered body is heated in step (c) at 130 to 200° C.

34. The producing process set forth in claim 1, wherein the corrosion-resistance ceramic member is a member to be exposed to a halogen-based corrosive gas in a semiconductor-producing apparatus.

35. The producing process set forth in claim 2, wherein the corrosion-resistance ceramic member is a member to be exposed to a halogen-based corrosive gas in a semiconductor-producing apparatus.

36. The producing process set forth in claim 2, wherein the concentration of the hydrofluoric acid is 1 to 50 wt %.

37. The producing process set forth in claim 3, wherein the concentration of the hydrofluoric acid is 1 to 50 wt %.

* * * * *